(12) United States Patent
Qian et al.

(10) Patent No.: US 11,875,722 B2
(45) Date of Patent: Jan. 16, 2024

(54) DISPLAY PANEL AND DISPLAY DEVICE

(71) Applicant: BOE TECHNOLOGY GROUP CO., LTD., Beijing (CN)

(72) Inventors: Yuhan Qian, Beijing (CN); Libin Liu, Beijing (CN); Long Han, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/771,102

(22) PCT Filed: May 20, 2021

(86) PCT No.: PCT/CN2021/094896
§ 371 (c)(1),
(2) Date: Apr. 22, 2022

(87) PCT Pub. No.: WO2021/258936
PCT Pub. Date: Dec. 30, 2021

(65) Prior Publication Data
US 2022/0375392 A1 Nov. 24, 2022

(30) Foreign Application Priority Data
Jun. 24, 2020 (CN) .......................... 202010590516.1

(51) Int. Cl.
*G09G 3/20* (2006.01)
*G11C 19/28* (2006.01)
(52) U.S. Cl.
CPC ............ *G09G 3/2092* (2013.01); *G11C 19/28* (2013.01); *G09G 2300/0452* (2013.01); *G09G 2300/0852* (2013.01); *G09G 2310/0286* (2013.01)

(58) Field of Classification Search
CPC ........... G11C 19/28; G09G 2310/0286; G09G 3/2092
See application file for complete search history.

(56) References Cited

U.S. PATENT DOCUMENTS

| 6,972,432 B1 | 12/2005 | Furuya |
| 9,754,531 B2 | 9/2017 | Fengli et al. |

(Continued)

FOREIGN PATENT DOCUMENTS

| CN | 103258477 A | 8/2013 |
| CN | 104318904 A | 1/2015 |

(Continued)

OTHER PUBLICATIONS

Written Opinion from PCT/CN2021/094896 dated Aug. 2, 2021.

(Continued)

*Primary Examiner* — Xuemei Zheng
(74) *Attorney, Agent, or Firm* — Calfee, Halter & Griswold LLP

(57) ABSTRACT

A display panel and a display device. The display panel comprises a transition region, and further comprises: a base substrate; multiple pixel units located on the side of the base substrate and integrated in the transition region; and a first gate drive circuit located on the side of the base substrate facing the pixel units, integrated in the transition region, and comprising a first shift register unit and a first signal line group. The first signal line group comprises a first signal line segment group used for providing a drive signal for the first shift register unit. The base substrate comprises multiple integration portions which are located between orthographic projections of two adjacent pixel units in the same row on the base substrate.

20 Claims, 9 Drawing Sheets

(56) References Cited

U.S. PATENT DOCUMENTS

| | | |
|---|---|---|
| 2013/0083080 A1 | 4/2013 | Rappoport |
| 2016/0035329 A1 | 2/2016 | Ekstrand |
| 2016/0253965 A1 | 9/2016 | Rappoport |
| 2016/0329015 A1 | 11/2016 | Fengli et al. |
| 2017/0193893 A1 | 7/2017 | Lee |
| 2019/0043414 A1 | 2/2019 | Wu |
| 2020/0380916 A1 | 12/2020 | Rappoport |
| 2020/0411611 A1 | 12/2020 | Liu |
| 2021/0376011 A1* | 12/2021 | Liu .................. H10K 59/121 |
| 2022/0271107 A1 | 8/2022 | Liu |

FOREIGN PATENT DOCUMENTS

| | | | | |
|---|---|---|---|---|
| CN | 104965338 | A | 10/2015 | |
| CN | 105140259 | A | 12/2015 | |
| CN | 106952602 | A | 7/2017 | |
| CN | 109389927 | A | 2/2019 | |
| CN | 109686842 | A | 4/2019 | |
| CN | 109728000 | A | 5/2019 | |
| CN | 109801602 | A | 5/2019 | |
| CN | 109872636 | A | 6/2019 | |
| CN | 110036692 | A | 7/2019 | |
| CN | 110223653 | A | 9/2019 | |
| CN | 110265458 | A | 9/2019 | |
| CN | 110459571 | A | 11/2019 | |
| CN | 111243442 | A | 6/2020 | |
| CN | 111261094 | A | 6/2020 | |
| CN | 111261094 | A * | 6/2020 | ............... G09G 3/20 |
| CN | 111276496 | A | 6/2020 | |
| EP | 3187928 | A1 | 7/2017 | |
| EP | 3223268 | A1 | 9/2017 | |
| EP | 3223268 | B1 | 5/2020 | |
| JP | 2007164142 | A | 6/2007 | |
| KR | 1020060101873 | A | 9/2006 | |
| KR | 20190048959 | A | 5/2019 | |
| WO | WO-2019192430 | A1 * | 10/2019 | ............... G09G 3/20 |

OTHER PUBLICATIONS

International Search Report from PCT/CN2021/094896 dated Aug. 2, 2021.

Communication from Chinese Application No. 202010590516.1 dated Nov. 11, 2022.

Dai, Shuang et al., "Pixel Circuit for OLED-on-silicon microdisplay using a driving MOS transistor operated in saturation region", Chinese Journal of Liquid Crystals and Displays, vol. 31, No. 1, Jan. 2016, pp. 97-103. English abstract included.

Communication from European Application No. 21828004.8 dated Jul. 21, 2023.

* cited by examiner

DISPLAY PANEL AND DISPLAY DEVICE

CROSS REFERENCE

The present disclosure is a U.S. National Stage of International Application No. PCT/CN2021/094896, filed on May 20, 2021, which claims priority to Chinese Patent Application No. 202010590516.1, filed on Jun. 24, 2020, entitled "DISPLAY PANEL AND DISPLAY DEVICE", both the entire contents of which are incorporated herein by reference in its entirety.

TECHNICAL FIELD

The present disclosure relates to the field of display technology, and in particular, to a display panel and a display device.

BACKGROUND

In the related art, corner positions of a four-curved display panel include a stretching region, a normal display region, and a transition region between the stretching region and the normal display region. A gate drive circuit is integrated in the transition region. A gate driving circuit usually includes cascaded shift register units and a signal line group for providing drive signals to the shift register unit. In the related art, the shift register unit and the signal line group are usually arranged between two adjacent pixel units in the same row. However, due to the large area of the shift register unit and the signal line group, the pixel drive circuit needs to be set at an offset position of the pixel opening.

It should be noted that the information disclosed in the Background section is only for enhancement of understanding of the background of the present disclosure, and therefore may contain information that does not form information of the prior art that is already known to a person of ordinary skill in the art.

SUMMARY

According to an aspect of the present disclosure, there is provided a display panel, including a display region, a border region located around the display region, a stretching region located at a corner of the display panel, a normal display region located in the display region, and a transition region located between the stretching region and the normal display region, wherein the display panel further includes: a base substrate, a plurality of pixel units, a first gate drive circuit and a second gate drive circuit. The plurality of pixel units are located on a side of the base substrate and integrated in the transition region, a plurality of the pixel units are distributed in the transition region in rows and columns. The first gate drive circuit is located on a side of the base substrate facing the pixel unit and integrated in the transition region, the first gate drive circuit includes a first shift register unit and a first signal line group, the first signal line group includes a first signal line segment group configured to provide a drive signal to the first shift register unit. The base substrate includes a plurality of integration portions, the integration portions are located between orthographic projections of two adjacent pixel units in an identical row on the base substrate, and an orthographic projection of the first shift register unit on the base substrate and an orthographic projection of the first signal line segment group on the base substrate are respectively located in different integration portions in an identical row. The second gate drive circuit is located on a side of the base substrate facing the pixel unit, and integrated in the border region, the second gate drive circuit includes a plurality of cascaded second shift register units. An amount of transistors in the first shift register unit is less than that of transistors in the second shift register unit.

In an exemplary embodiment of the present disclosure, the orthographic projection of the first shift register unit on the base substrate and the orthographic projection of the first signal line segment group on the base substrate are respectively located in two adjacent integration portions in an identical row.

In an exemplary embodiment of the present disclosure, a plurality of the pixel units form a plurality of pixel islands distributed in rows and columns, and an orthographic projection of the first gate drive circuit on the base substrate is located between orthographic projections of adjacent pixel islands on a plane where the base substrate is located.

In an exemplary embodiment of the present disclosure, each of the pixel islands includes two pixel units distributed along a column direction, and each of the pixel islands includes: a B pixel opening and a R pixel opening located in a first pixel opening row and adjacently arranged, two G pixel openings located in a second pixel opening row and distributed along the column direction, and a B pixel opening and a R pixel opening located in a third pixel opening row and arranged adjacently; wherein the second pixel opening row is located between the first pixel opening row and the third pixel opening row, pixel openings of an identical color are located in an identical pixel opening column, and pixel openings of different colors are located in different pixel opening columns.

In an exemplary embodiment of the present disclosure, the first gate drive circuit includes a plurality of cascaded first shift register units, and the first signal line group includes first signal line segment groups arranged in one-to-one correspondence with the first gate drive circuit, and the first signal line segment groups are respectively configured to provide the drive signal to corresponding first shift register units.

In an exemplary embodiment of the present disclosure, the transition region includes a bending edge region extending along a curve, and orthographic projections of at least a part of the first shift register units located in the bending edge region on the base substrate are located in different columns, and correspondingly, orthographic projections of at least a part of the first signal line segment groups located in the bending edge region on the base substrate are located in different columns.

In an exemplary embodiment of the present disclosure, the first signal line segment groups located in different columns are connected through a connection line segment group extending in a row direction, an orthographic projection of the connection line segment group on the base substrate is located between the orthographic projections of the adjacent pixel islands on the plane where the base substrate is located.

In an exemplary embodiment of the present disclosure, the first signal line group includes one or more of a clock signal line and a power supply signal line.

In an exemplary embodiment of the present disclosure, the display panel further includes: a second signal line group, configured to provide a drive signal to a plurality of the second shift register units; wherein the second shift register unit and the first shift register unit are cascaded, and signal lines of an identical type in the first signal line group and in the second signal line group are connected.

In an exemplary embodiment of the present disclosure, the first shift register unit includes: a first input circuit, connected to a first clock signal terminal, a first power supply terminal and a first node, configured to transmit a signal of the first power supply terminal to the first node in response to a signal of the first clock signal terminal; a second input circuit, connected to the first clock signal terminal, a signal input terminal and a second node, and configured to transmit a signal of the signal input terminal to the second node in response to the signal of the first clock signal terminal; a control circuit, connected to the first node, the second node and the first clock signal terminal, configured to transmit the signal of the first clock signal terminal to the first node in response to a signal of the second node; a first output circuit, connected to the first node, a second power supply terminal and an output terminal, and configured to transmit a signal of the second power supply terminal to the output terminal in response to a signal of the first node; a second output circuit, connected to the second node, a second clock signal terminal and the output terminal, and configured to transmit a signal of the second clock signal terminal to the output terminal in response to the signal of the second node.

In an exemplary embodiment of the present disclosure, the first input circuit includes: a first transistor, having a first end connected to the first power supply terminal, a second end connected to the first node, and a control end connected to the first clock signal terminal; the second input circuit includes: a second transistor, having a first end connected to the signal input terminal, a second end connected to the second node, and a control end connected to the first clock signal terminal; the control circuit includes: a third transistor, having a first end connected to the first node, a second end connected to the first clock signal terminal, and a control end connected to the second node; the first output circuit includes: a fourth transistor, having a first end connected to the second power supply terminal, a second end connected to the output terminal, and a control end connected to the first node; a first capacitor, connected between the second power supply terminal and the first node; the second output circuit includes: a fifth transistor, having a first end connected to the second clock signal terminal, a second end connected to the output terminal, and a control end connected to the second node; a second capacitor, connected between the second node and the output terminal.

In an exemplary embodiment of the present disclosure, the second shift register unit includes: a first transistor, having a first end connected to a signal input terminal, a second end connected to a first node, and a control end connected to a first clock signal terminal; a second transistor, having a first end connected to the first clock signal terminal, a second end connected to a second node, and a control end connected to the first node; a third transistor, having a first end connected to a first power supply terminal, a second end connected to the second node, and a control end connected to the first clock signal terminal; a fourth transistor, having a first end connected to a second power supply terminal, a second end connected to an output terminal, and a control end connected to the second node; a first capacitor, connected between the second node and the second power supply terminal; a fifth transistor, having a first end connected to the second power supply terminal, a second end connected to a third node, and a control end connected to the second node; a sixth transistor, having a first end connected to the third node, a second end connected to the first node, and a control end connected to a second clock signal terminal; a seventh transistor, having a first end connected to the first node, a second end connected to a fourth node, and a control end connected to the first power supply terminal; an eighth transistor, having a first end connected to the output terminal, a second end connected to the second clock signal terminal, and a control end connected to the fourth node; a second capacitor, connected between the fourth node and the output terminal.

In an exemplary embodiment of the present disclosure, the first signal line segment group is connected to the first shift register unit through a first connection line group extending along a row direction; the first signal line segment group includes: a first clock signal line segment, a second clock signal line segment, a first power supply line segment, and a second power supply line segment; the first connection line group includes: a first clock connection line, a second clock connection line, a first power supply connection line, and a second power supply connection line; wherein the first clock signal line is connected to gates of the first transistor and the second transistor through the first clock connection line, the second clock signal line segment is connected to a source/drain of the fifth transistor through the second clock connection line, the first power supply line segment is connected to a source/drain of the third transistor through the first power supply connection line, and the second power supply line segment is connected to an electrode of the first capacitor through the second power supply connection line.

In an exemplary embodiment of the present disclosure, the display panel includes an active layer, a first conductive layer, a second conductive layer, and a third conductive layer that are sequentially stacked on a side of the base substrate; a part of the active layer is configured to form a channel region of the transistor in the first shift register unit, and a part of the first conductive layer is configured to form a gate of the transistor in the first shift register unit and a first electrode of the first capacitor and the second capacitor, a part of the second conductive layer is configured to form a second electrode of the first capacitor and the second capacitor, and a part of the third conductive layer is configured to form a source/drain of the transistor in the first shift register unit; the first power supply signal line segment is located on a side of the first shift register unit, the first clock signal line segment, the second clock signal line segment and the second power supply line segment are located on a side of the first power supply signal line segment away from the first shift register unit; the first power supply connection line is formed by a part of the third conductive layer, and the first clock connection line and the second clock connection line are formed by a part of the first conductive layer; the second power supply connection line includes a first connection portion and a second connection portion, the first connection portion is connected to the second power supply line segment through a via hole, the second connection portion is connected to the second electrode of the first capacitor through a via hole, and the first connection portion and the second connection portion are connected through a via hole located between the second power supply line segment and the first capacitor, wherein the first connection portion is formed by a part of the first conductive layer, and a second conductive portion is formed of a part of the third conductive layer.

In an exemplary embodiment of the present disclosure, the display panel includes a pixel unit located between the first shift register unit and the first signal line segment group; an orthographic projection of the first clock connection line on the base substrate and an orthographic projection of the second clock connection line on the base substrate are respectively located on opposite two sides of the pixel unit.

In an exemplary embodiment of the present disclosure, the first transistor, the second transistor and the third transistor are located on a side of the fourth transistor and the fifth transistor away from a pixel unit, and the output terminal is connected to an adjacent pixel drive circuit in the pixel unit through a gate line.

In an exemplary embodiment of the present disclosure, the second capacitor is located on a side of the fourth transistor and the fifth transistor away from the first transistor, the second transistor and the third transistor.

In an exemplary embodiment of the present disclosure, the pixel unit includes a switching transistor, and the second end of the fifth transistor is connected to the gate of the switching transistor in the adjacent pixel unit through a gate line; wherein, the gate of the switching transistor and the gate line are formed by a part of the first conductive layer.

In an exemplary embodiment of the present disclosure, the display panel further includes a stretching region located at a corner of the display panel, and a normal display region located in the display region, and the transition region is located between the stretching region and the normal display region.

In an exemplary embodiment of the present disclosure, a pixel density in the transition region is smaller than that in the normal display region.

In an exemplary embodiment of the present disclosure, the stretching region includes a first stretching region located in the display region, and a pixel density in the first stretching region is smaller than that in the normal display region.

In an exemplary embodiment of the present disclosure, the display panel includes an array substrate and an encapsulation layer encapsulated on a side of the array substrate, wherein the stretching region is provided with a hollow opening penetrating the array substrate and the encapsulation layer.

According to an aspect of the present disclosure, there is provided a display device, including the display panels described above.

It should be noted that the above general description and the following detailed description are merely exemplary and exemplary and should not be construed as limiting of the present disclosure.

BRIEF DESCRIPTION OF THE DRAWINGS

The accompanying drawings, which are incorporated in and constitute a part of this specification, illustrate embodiments consistent with the disclosure and serve to explain the principles of the disclosure together with the description. The drawings in the following description are only some embodiments of the present disclosure, and for those of ordinary skill in the art, other drawings can also be obtained from these drawings without creative effort.

DETAILED DESCRIPTION

Figure 1:
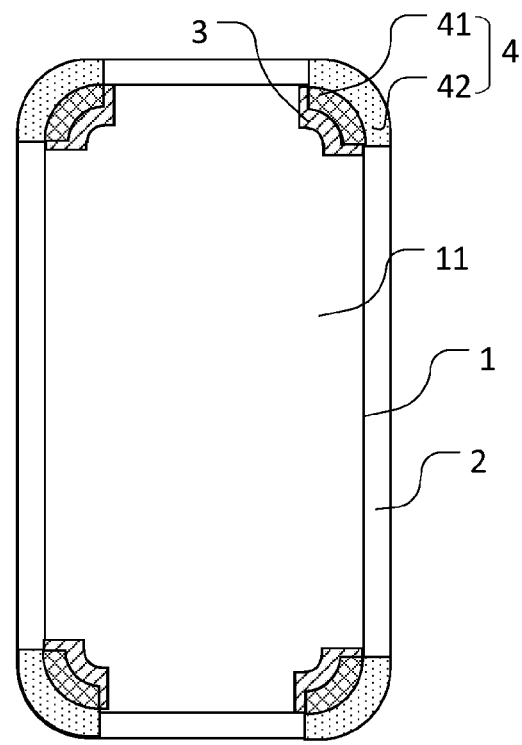
FIG. 1 is a schematic structural diagram of a four-curved screen display panel in the related art.

Example embodiments will now be described more fully with reference to the accompanying drawings. Example embodiments, however, can be embodied in various forms and should not be construed as limited to the embodiments set forth herein; rather, these embodiments are provided so that this disclosure will be thorough and complete, and will fully convey the concept of example embodiments to those skilled in the art. The same reference numerals in the drawings denote the same or similar structures, and thus their detailed descriptions will be omitted.

Although relative terms such as "on" and "under" are used in this specification to describe the relative relationship of one component of an icon to another component, these terms are used in this specification only for convenience, such as according to the directions of the examples in the accompanying drawings. It will be appreciated that if the device of the icon is turned upside down, the component described as "on" will become the component described as "under". Other relative terms, such as "high", "low", "top", "bottom", "left" and "right" also have similar meanings. When a certain structure is "on" other structures, it may mean that a certain structure is integrally formed on other structures, or that a certain structure is "directly" arranged on other structures, or that a certain structure is "indirectly" arranged on another structure through another structure.

The terms "a", "an", "the" are used to indicate the presence of one or more elements/components/etc.; the terms "including" and "having" are used to indicate an open-ended inclusive meaning and refer to additional elements/components/etc. may be present in addition to the listed elements/components/etc.

As shown in FIG. 1, it is a schematic structural diagram of a four-curved screen display panel in the related art. The four-curved screen display panel includes a display region 1 and a border region 2 located around the display region 1. The display panel also includes a stretching region 4 located at the corner of the display panel. The stretching region 4 includes a stretching region 41 is located in the display region 1 and a second stretching region 42 located in the border region 2. The display panel further includes a normal display region 11 located in the display region 1 and a transition region 3 located between the normal display region 11 and the first stretching region 41. In the related art, the pixel density in the transition region 3 is smaller than that in the normal display region 11. A gate driving circuit may be integrated on the transition region 3, and the gate driving circuit may be used to provide the pixel drive circuit with a gate drive signal or an enable signal.

Figure 2:
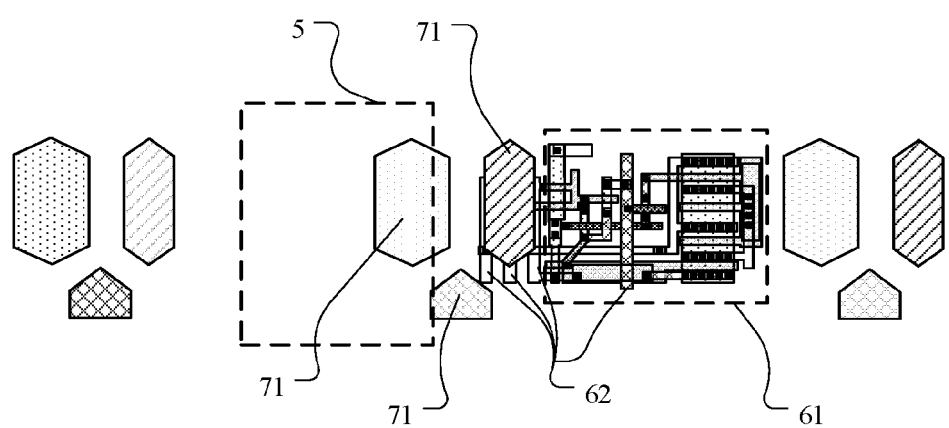
FIG. 2 is a structural diagram of a transition region of a four-curved screen display panel in the related art.

As shown in FIG. 2, it is a structural diagram of a transition region of a four-curved screen display panel in the related art. The transition region 3 may be integrated with a plurality of pixel units distributed in rows and columns and a gate driving circuit. As shown in FIG. 2, the gate driving circuit may include a shift register unit 61 and a signal line group 62. The shift register unit 61 may include a plurality of transistors and a plurality of capacitor structures. As shown in FIG. 2, the shift register unit 61 and the signal line group 62 may be disposed between two adjacent pixel units in the same row. As shown in FIG. 2, since the occupied area of the shift register unit 61 and the signal line group 62 is large, the pixel drive circuit 5 on a side of the shift register unit 61 and the signal line group 62 needs to be offset from the pixel opening 71. Correspondingly, the pixel drive circuit 5 needs to be connected to the anode at the position of the pixel opening 71 by extending the anode wiring. However, the pixel drive circuits in other pixel units do not need to be offset from the pixel opening, and their pixel drive circuits are located directly below the pixel opening. At the same time, since the extended anode wring itself has a certain resistance, the drive signal output by the offset pixel drive circuit to the anode has a certain voltage drop, which will cause that the shifted pixel driving circuit and the non-shifted pixel driving circuit provide different driving voltages to the anode, which eventually leads to uneven display of the display panel.

Figure 3:
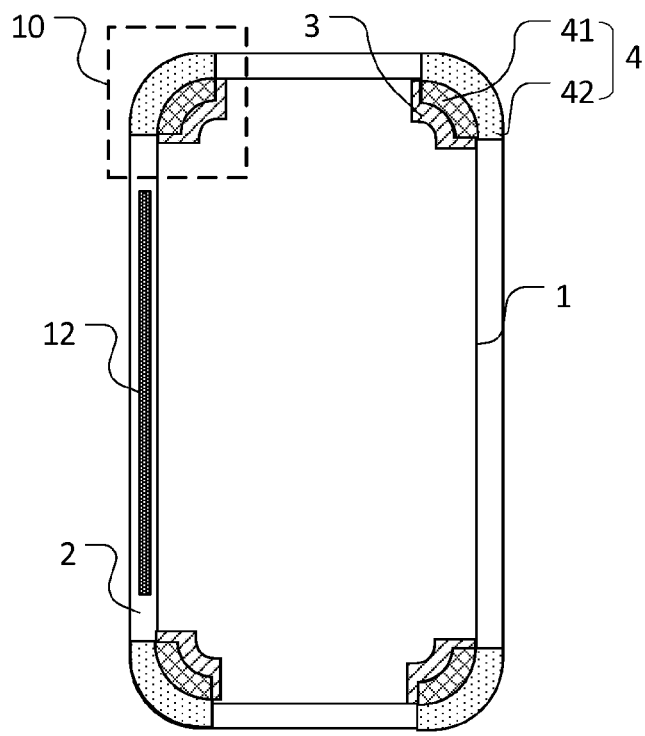
FIG. 3 is a schematic structural diagram of an exemplary embodiment of a display panel of the present disclosure.
Figure 4:
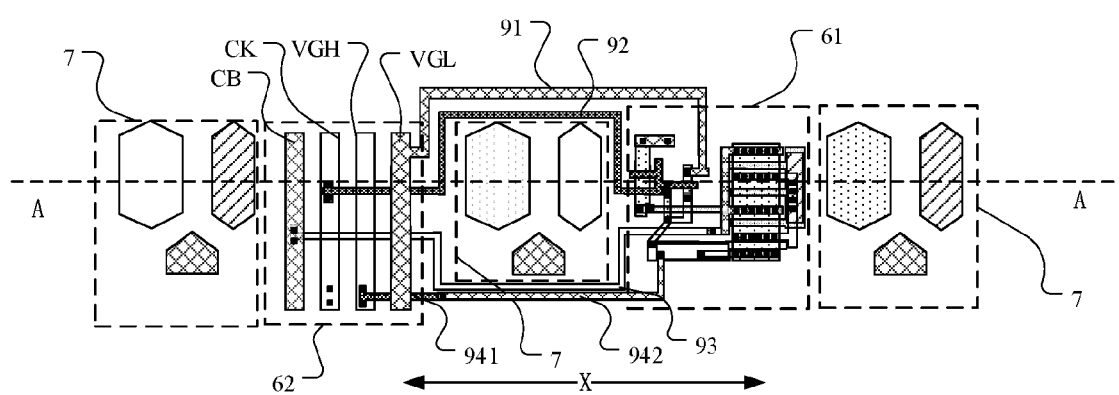
FIG. 4 is a schematic structural diagram of a transition region in an exemplary embodiment of a display panel of the present disclosure.
Figure 5:
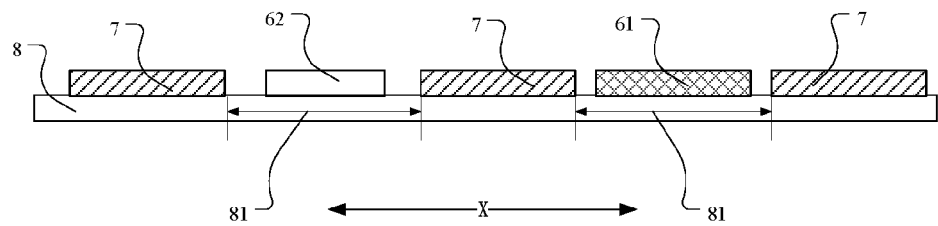
FIG. 5 is the sectional view of the dotted line A-A in FIG. 4.

Based on this, the present exemplary embodiment provides a display panel, as shown in FIGS. 3, 4 and 5. FIG. 3 is a schematic structural diagram of an exemplary embodiment of the display panel of the present disclosure. FIG. 4 is a schematic structural diagram of a transition region in an exemplary embodiment of a display panel of the present disclosure. FIG. 5 is the sectional view of the dotted line A-A in FIG. 4. The display panel includes a transition region 3 located in the display region 1. The display panel further includes: a base substrate 8, a plurality of pixel units 7, and a first gate drive circuit. A plurality of pixel units 7 are located on a side of the base substrate and integrated in the transition region 3, and a plurality of the pixel units 7 are distributed in the transition region in rows and columns. The dotted line A-A may extend along the row direction X. The first gate drive circuit is located on the side of the base substrate facing the pixel unit 7 and integrated in the transition region 3. The first gate drive circuit may include a first shift register unit 61 and a first signal line group. The first signal line group may include a first signal line segment group 62 for providing drive signals to the first shift register unit. The base substrate 8 may include a plurality of integration portions 81. The integration portion 81 can be located between the orthographic projections of the two adjacent pixel units 7 in the same row on the base substrate. The orthographic projection of the first shift register unit 61 on the base substrate and the orthographic projections of the first signal line segment group 62 on the base substrate are respectively located in different integration portions of the same row.

In the display panel provided by the present disclosure, the orthographic projection of the first shift register unit 61 on the base substrate and the orthographic projection of the first signal line segment group 62 on the base substrate are respectively arranged in different integration portions 81 in the same row, thereby avoiding display unevenness due to the offset of the pixel drive circuit in the transition region.

In an exemplary embodiment, as shown in FIG. 3, the display panel may further include a stretching region 4 located at a corner of the display panel, and a normal display region 11 located in the display region. The transition region 3 may be located between the stretching region 4 and the normal display region 11. In an exemplary embodiment, the pixel density in the transition region 3 may be smaller than that in the normal display region, so as to reserve space for arranging the first gate drive circuit. In an exemplary embodiment, the display panel may include an array substrate and an encapsulation layer encapsulated on one side of the array substrate. The stretching region 4 is provided with a hollow opening penetrating the array substrate and the encapsulation layer. The hollow opening can enhance the bending ability of the stretching region 4, so that four sides of the display panel can be bent toward the backplane. The stretching region 4 may include a first stretching region 41 located in the display region 1 and a second stretching region 42. The pixel density in the first stretching region 41 may be smaller than that in the normal display region, to reserve space for setting the hollow opening. The second stretching region 42 may be located in the border region of the display panel.

In an exemplary embodiment, as shown in FIG. 5, the orthographic projection of the first shift register unit 61 on the base substrate 8 and the orthographic projection of the first signal line segment group 62 on the base substrate 8 can be respectively located in two adjacent integration portions 81 in the same row. This setting can reduce the length of the signal connection line between the first signal line segment group 62 and the first shift register unit 61. It should be understood that, in other exemplary embodiments, the orthographic projection of the first shift register unit 61 on the base substrate 8 and the orthographic projection of the first signal line segment group 62 on the base substrate 8 may also be respectively located in two non-adjacent integration portions 81 in the same row.

Figure 6:
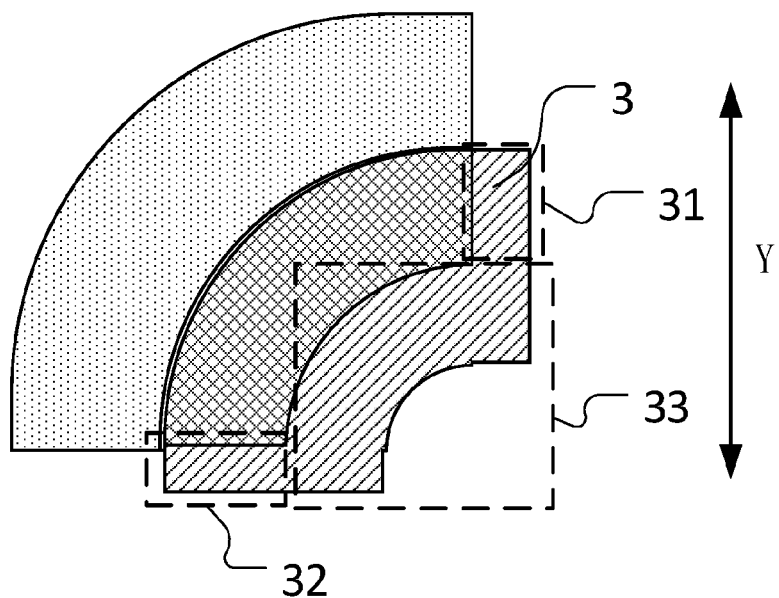
FIG. 6 is a partial enlarged view of the dotted frame 10 in FIG. 3.

In an exemplary embodiment, as shown in FIG. 6, it is a partial enlarged view of the dotted frame 10 in FIG. 3. In an exemplary embodiment, the transition region 3 may include a first extension region 31, a second extension region 32, and a third extension region 33 connected between the first extension region 31 and the second extension region 32. As shown in FIG. 6, the first extension region 31 may extend linearly along the column direction Y, the third extension region 33 may extend along a curve, and the second extension region 32 may linearly extend along the column direction Y. Orthographic projections of a part of the first shift register units located in the third extension region 33 on the base substrate may be located in different pixel columns, such that the cascading direction of the first shift register units in the first gate drive circuit is the same as the extending direction of the third extension region 33. It should be understood that, in the first extension region 31 and the second extension region 32, the first shift register units may be linearly cascaded along the column direction. That is, the first shift register units in the first extension region 31 and the second extension region 32 are located in the same pixel column.

Figure 7:
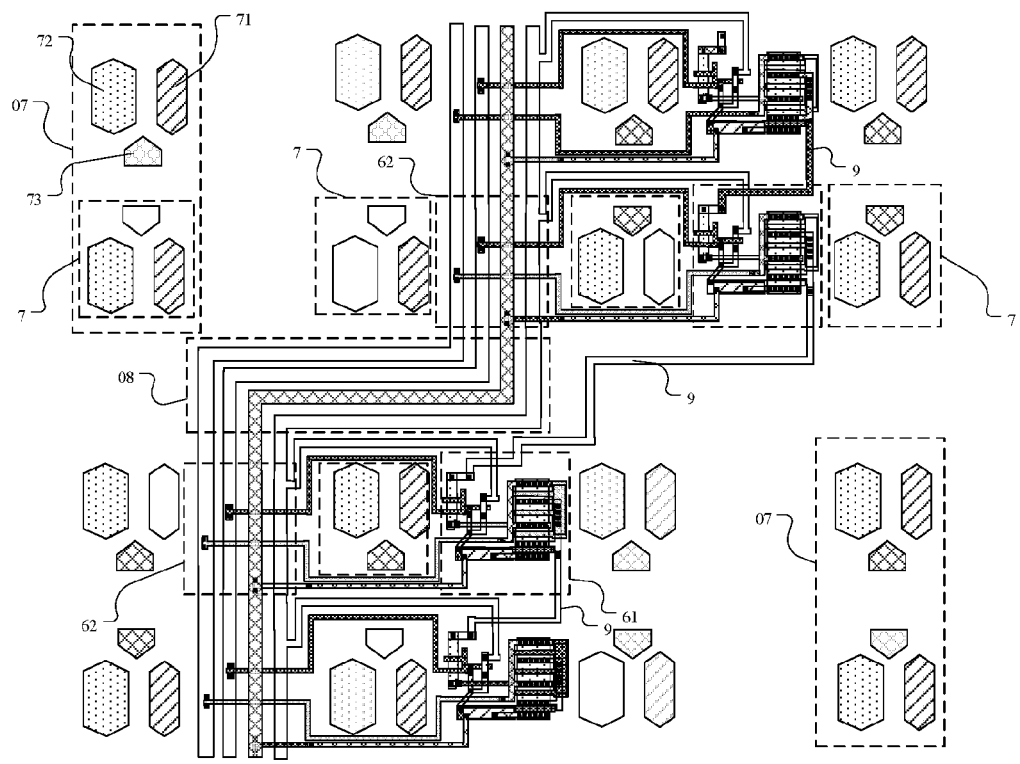
FIG. 7 is a schematic structural diagram of a transition region in an exemplary embodiment of a display panel of the present disclosure.

In an exemplary embodiment, as shown in FIG. 7, it is a schematic structural diagram of the third extension region of the transition region in an exemplary embodiment of the display panel of the present disclosure. The first gate drive circuit may include a plurality of cascaded first shift register units 61. As shown in FIG. 7, this exemplary embodiment only exemplarily draws four cascaded first shift register units 61. The two cascaded first shift register units 61 can be cascaded through the connection line 9. The first signal line group may include a plurality of first signal line segment groups 62 arranged in one-to-one correspondence with the first gate drive circuit, and the first signal line segment group 62 is used to provide drive signals to the corresponding first shift register unit 61. The signal lines of the same type in the plurality of first signal line segment groups 62 are connected to each other. For example, as shown in FIG. 4, the first signal line segment group 62 may include a first clock signal line segment CK, a second clock signal line segment CB, a first power supply line segment VGL, and a second power supply line segment VGH. The first clock signal line segments CK in each group of the first signal line segment groups 62 are connected to each other. The second clock signal line segments CB in each group of first signal line segment groups 62 are connected to each other. The first power supply line segments VGL in each group of first signal line segment groups 62 are connected to each other. The second power supply line segments VGH in each group of the first signal line segment groups 62 are connected to each other. In FIG. 7, the orthographic projections of the first shift register unit of the second pixel row and the first shift register unit of the third pixel row on the base substrate are located in different pixel columns, so that the first shift register units can be cascaded along the curve direction. It should be understood that, in other exemplary embodiments, the first signal line group may also include signal lines of other numbers and types. For example, the first signal line group may include one or more of a clock signal line, a power supply signal line.

As shown in FIG. 7, in an exemplary embodiment, a plurality of the pixel units 7 may form a plurality of pixel islands 07 distributed in rows and columns, and the orthographic projection of the first gate drive circuit on the base substrate may be located between the orthographic projections of adjacent pixel islands on the plane where the base substrate is located. Orthographic projections of at least a part of the first signal line segment groups located in the bending edge region on the base substrate are located in different columns. For example, as shown in FIG. 7, the first signal line segment group in the third pixel row and the first signal line segment group in the second pixel row are located in different columns. As shown in FIG. 7, the first signal line segment groups located in different columns may be connected by a connection line segment group 08 extending in the row direction, and the orthographic projection of the connection line segment group 08 on the base substrate may be located between the orthographic projections of the adjacent pixel islands on the plane where the base substrate is located.

As shown in FIG. 7, each of the pixel islands 07 may include two pixel units 7 distributed along the column direction, and each of the pixel islands includes: a B pixel opening 71 and a R pixel opening 72 located in a first pixel opening row and adjacently arranged, two G pixel openings 73 located in a second pixel opening row and distributed along the column direction, and a B pixel opening 71 and a R pixel opening 72 located in a third pixel opening row and arranged adjacently. The second pixel opening row is located between the first pixel opening row and the third pixel opening row, pixel openings of an identical color are located in an identical pixel opening column, and pixel openings of different colors are located in different pixel opening columns.

As shown in FIG. 3, the display panel may further include a border region 2 at the periphery of the display region, and the display panel may further include a second gate drive circuit 12. The second gate drive circuit 12 is located on a side of the base substrate facing the pixel unit and is integrated in the border region 2. The second gate drive circuit 12 may include a plurality of cascaded second shift register units, and a second signal line group configured to provide a drive signal to a plurality of the second shift register units. The first gate drive circuit may be used to provide drive signals to all pixel units in the same row as the pixel units in the transition region. The second gate drive circuit can be used to provide drive signals to the remaining pixel units. The second shift register unit may be cascaded with the first shift register unit, and the first signal line group may be connected to the same type of signal lines in the second signal line group. That is, the first shift register unit and the second shift register unit may be connected to the same signal line group, and the signal line group may supply the same clock signal and power supply signal to the first shift register unit and the second shift register unit at the same time. The first shift register unit and the second shift register unit can realize step-by-step driving under the action of the same clock signal and power supply signal.

In an exemplary embodiment, the number of transistors in the first shift register unit may be smaller than the number of transistors in the second shift register unit. This arrangement can make the orthographic projection of the first shift register unit located in the transition region on the base substrate have a small area, so as to facilitate the design layout of the display panel. It should be understood that, in other exemplary embodiments, the number of transistors in the first shift register unit may also be equal to or greater than the number of transistors in the second shift register unit.

The following exemplary embodiment provides specific structures of a first shift register unit and a second shift register unit.

Figure 8:
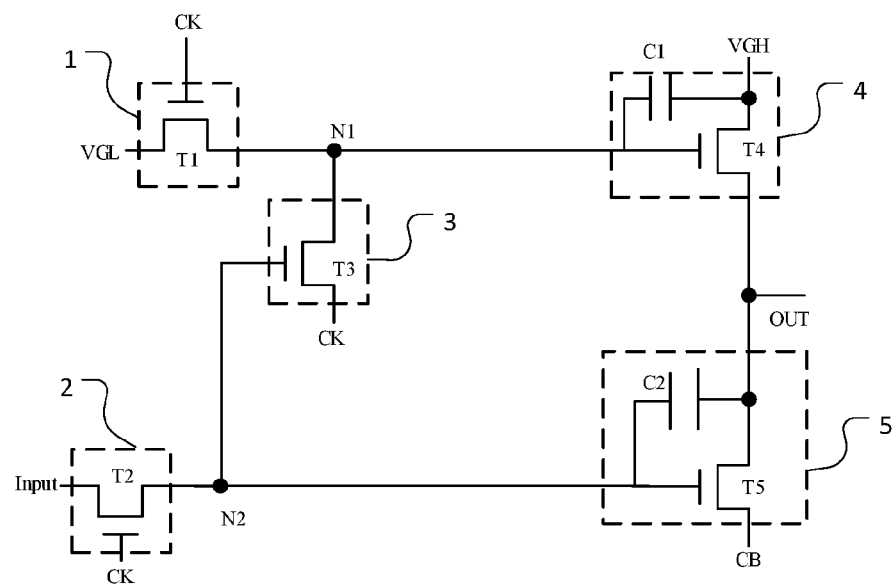
FIG. 8 is a schematic structural diagram of a first shift register unit in an exemplary embodiment of a display panel of the present disclosure.

In an exemplary embodiment, as shown in FIG. 8, it is a schematic structural diagram of a first shift register unit in an exemplary embodiment of the display panel of the present disclosure. The first shift register unit includes: a first input circuit 1, a second input circuit 2, a control circuit 3, a first output circuit 4, and a second output circuit 5. The first input circuit 1 is connected to a first clock signal terminal CK, a first power supply terminal VGL and a first node N1, configured to transmit a signal of the first power supply terminal VGL to the first node N1 in response to a signal of the first clock signal terminal CK. The second input circuit 2 is connected to the first clock signal terminal CK, a signal input terminal Input and a second node N2, and configured to transmit a signal of the signal input terminal Input to the second node N2 in response to the signal of the first clock signal terminal CK. The control circuit 3 is connected to the first node N1, the second node and N2 and the first clock signal terminal CK, configured to transmit the signal of the first clock signal terminal CK to the first node N1 in response to a signal of the second node N2. The first output circuit 4 is connected to the first node N1, a second power supply terminal VGL and an output terminal OUT, and configured to transmit a signal of the second power supply terminal VGL to the output terminal OUT in response to a signal of the first node N1. The second output circuit 5 is connected to the second node N2, a second clock signal terminal CB and the output terminal OUT, and configured to transmit a signal of the second clock signal terminal CB to the output terminal OUT in response to the signal of the second node N2.

In an exemplary embodiment, the first input circuit 1 may include a first transistor T1, and the first transistor T1 has a first end connected to the first power supply terminal VGL, a second end connected to the first node N1, and a control end connected to the first clock signal terminal CK. The second input circuit 2 may include a second transistor T2, and the second transistor T2 has a first end connected to the signal input terminal Input, a second end connected to the second node N2, and a control end connected to the first clock signal terminal CK. The control circuit includes a third transistor T3, and the third transistor T3 has a first end connected to the first node N1, a second end connected to the first clock signal terminal CK, and a control end connected to the second node N2. The first output circuit 4 may include a fourth transistor T4 and a first capacitor C1. The fourth transistor T4 has a first end connected to the second power supply terminal VGH, a second end connected to the output terminal OUT, and a control end connected to the first node N1. The first capacitor C1 may be connected between the second power supply terminal VGH and the first node N1. The second output circuit may include a fifth transistor T5 and a second capacitor C2. The fifth transistor T5 has a first end connected to the second clock signal terminal CB, a second end connected to the output terminal OUT, and a control end connected to the second node N2. The second capacitor C2 is connected between the second node N2 and the output terminal OUT. The first to fifth transistors may be P-type transistors.

Figure 9:
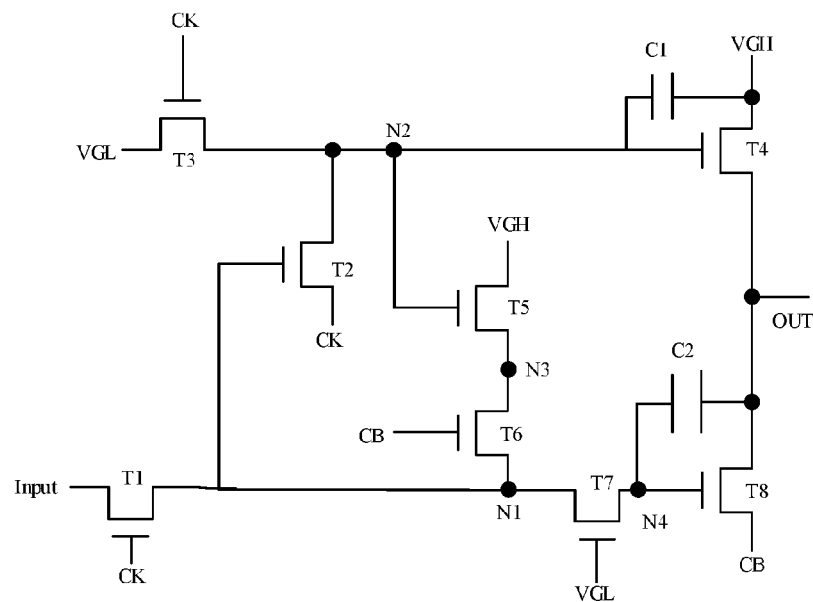
FIG. 9 is a schematic structural diagram of a second shift register unit in an exemplary embodiment of a display panel of the present disclosure.

In an exemplary embodiment, as shown in FIG. 9, it is a schematic structural diagram of a second shift register unit in an exemplary embodiment of the display panel of the present disclosure. The second shift register unit may include a first transistor T1, a second transistor T2, a third transistor T3, a fourth transistor T4, a first capacitor C1, a fifth transistor T5, a sixth transistor T6, a seventh transistor T7, The eighth transistor T8 and the second capacitor C2. The first transistor T1 has a first end connected to the signal input terminal Input, a second end connected to the first node N1, and a control end connected to the first clock signal terminal CK. The second transistor T2 has a first end connected to the first clock signal terminal CK, a second end connected to the second node N2, and a control end connected to the first node N1. The third transistor T3 has a first end connected to the first power supply terminal VGL, a second end connected to the second node N2, and a control end connected to the first clock signal terminal CK. The fourth transistor T4 has a first end connected to the second power supply terminal VGH, a second end connected to the output terminal OUT, and a control end connected to the second node N2. The first capacitor C1 is connected between the second node N2 and the second power supply terminal VGH. The fifth transistor T5 has a first end connected to the second power supply terminal VGH, a second end connected to the third node N3, and a control end connected to the second node N2. The sixth transistor T6 has a first end connected to the third node N3, a second end connected to the first node N1, and a control end connected to the second clock signal terminal CB. The seventh transistor T7 has a first end connected to the first node N1, a second end connected to the fourth node N4, and a control end connected to the first power supply terminal VGL. The eighth transistor T8 has a first end connected to the output terminal OUT, a second end connected to the second clock signal terminal CB, and a control end connected to the fourth node N4. The second capacitor C2 is connected between the fourth node N4 and the output terminal OUT. The first to eighth transistors may be P-type transistors.

Figure 10A:
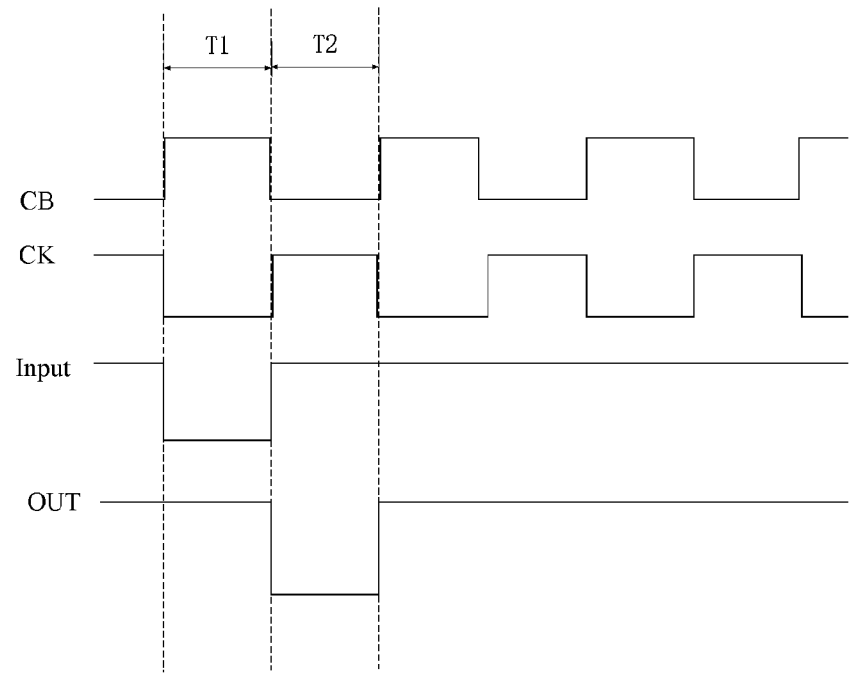
FIG. 10a is a timing diagram of each node in a driving method of the first shift register unit shown in FIG. 8.

As shown in FIG. 10a, it is a timing diagram of each node in a driving method of the first shift register unit shown in FIG. 8. The first to fifth transistors may be P-type transistors. In FIG. 8, the first power supply terminal VGL continuously outputs a low level, and the second power supply terminal VGH continuously outputs a high level. The driving method of the first shift register unit shown in FIG. 8 includes two stages: a first stage and a second stage. In the first stage T1, the first clock signal terminal CK outputs a low-level signal, the second clock signal terminal CB outputs a high-level signal, the signal input terminal Input outputs a low-level signal, and the first to fifth switching transistors are all turned on, the output terminal OUT outputs a high-level signal. In the second stage T2, the first clock signal terminal CK outputs a high-level signal, the second clock signal terminal CB outputs a low-level signal, and the signal input terminal Input outputs a high-level signal, the fifth transistor T5 is turned on, the second transistor, the first transistor, and the fourth transistor are all turned off, and the output terminal outputs a low level.

Figure 10B:
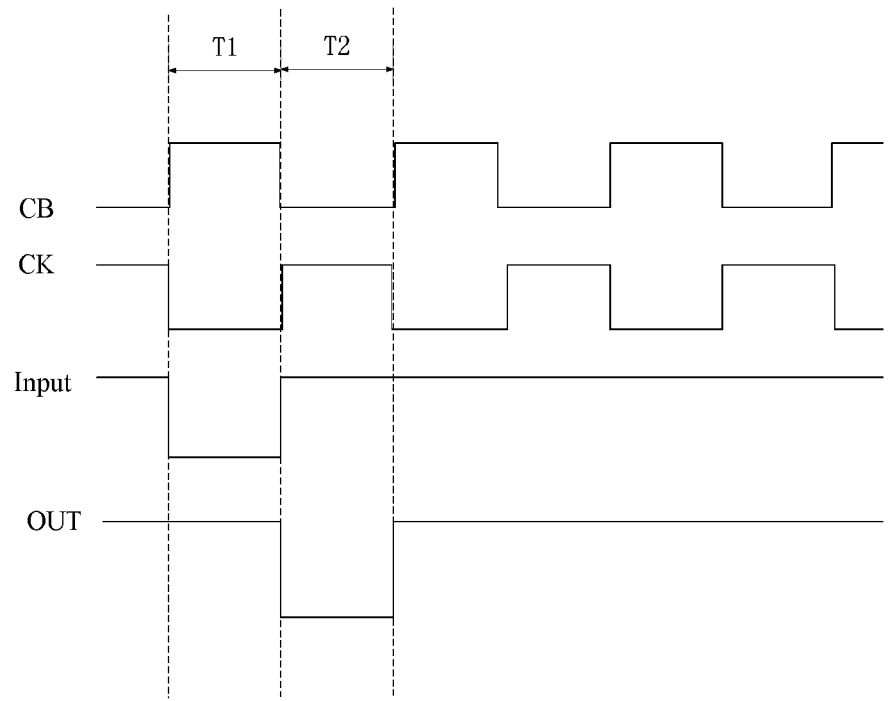
FIG. 10b is a timing diagram of each node in a driving method of the second shift register unit shown in FIG. 9.

As shown in FIG. 10b, it is a timing diagram of each node in a driving method of the second shift register unit shown in FIG. 9. The first to eighth transistors may be P-type transistors. In FIG. 9, the first power supply terminal VGL continuously outputs a low level, and the second power supply terminal VGH continuously outputs a high level. The driving method of the second shift register unit shown in FIG. 9 includes two stages: a first stage and a second stage. In the first stage T1, the first clock signal terminal CK outputs a low-level signal, the second clock signal terminal CB outputs a high-level signal, the signal input terminal Input outputs a low-level signal, the first transistor, the second transistor and the fourth transistor are turned on, and the output terminal outputs a high level. In the second stage T2, the first clock signal terminal CK outputs a high-level signal, the second clock signal terminal CB outputs a low-level signal, the signal input terminal Input outputs a high-level signal, the first transistor, the third transistor, and the fourth transistor are turned off, the eighth transistor is turned on, and the output terminal outputs a low level.

According to FIG. 10a and FIG. 10b, the first shift register unit and the second shift register unit in an exemplary embodiment can realize their own driving under the action of the same drive signal. That is, the first shift register unit and the second shift register unit can be connected to the same signal line group.

It should be understood that, in other exemplary embodiments, the first shift register unit and the second shift register unit may also select other structures, which all belong to the protection scope of the present disclosure.

In an exemplary embodiment, the first shift register unit adopts a 5T2C structure, and the second shift register unit adopts an 8T2C structure. The number of transistors in the first shift register unit may be smaller than the number of transistors in the second shift register unit. This arrangement can make the orthographic projection of the first shift register unit located in the transition region on the base substrate have a small area, so as to facilitate the design layout of the display panel.

Figure 11:
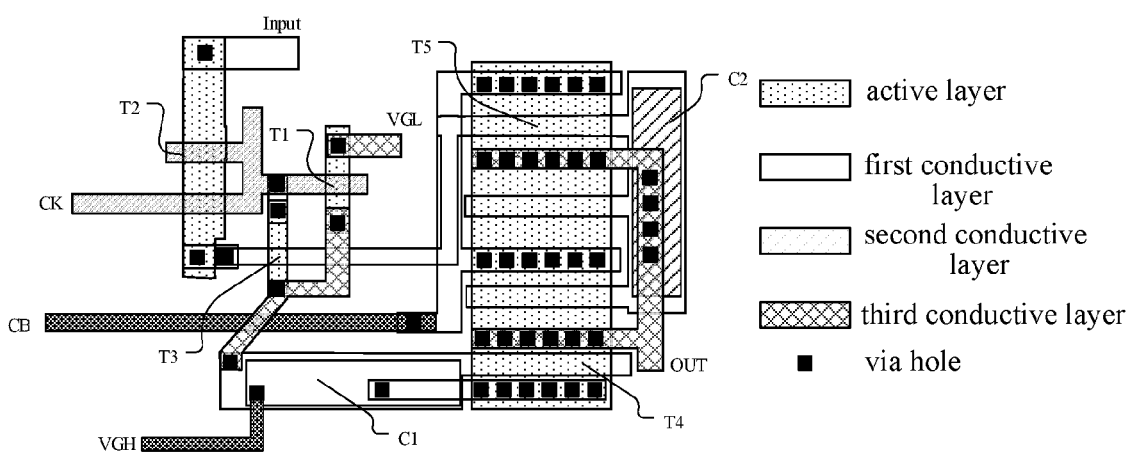
FIG. 11 is a partial enlarged view of the first shift register unit in FIGS. 4 and 6.

In an exemplary embodiment, as shown in FIG. 11, it is a partial enlarged view of the first shift register unit in FIGS. 4 and 6. The first shift register unit may include a first transistor T1, a second transistor T2, a third transistor T3, a fourth transistor T4, a fifth transistor T5, a first capacitor C1, and a second capacitor C2. The connection structure of the transistor and the capacitor in the first shift register unit is the same as the circuit structure in FIG. 8.

The first shift register unit may be formed by an active layer, a first conductive layer, a second conductive layer, and a third conductive layer that are sequentially stacked on the base substrate.

Figure 12:
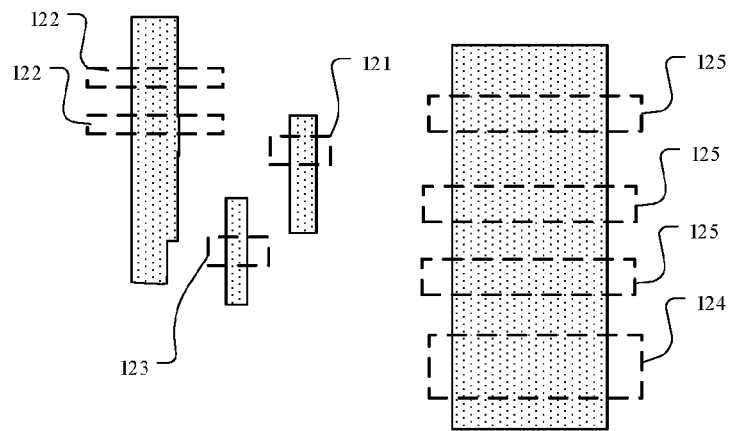
FIG. 12 is a schematic structural diagram of the active layer in FIG. 11.

FIG. 12 is a schematic structural diagram of the active layer in FIG. 11. The active layer includes a first active portion 121, a second active portion 122, a third active portion 123, a fourth active portion 124, and a fifth active portion 125. The first active portion 121 is used to form the channel region of the first transistor T1. The second active portion 122 is used to form the channel region of the second transistor T2. The third active portion 123 is used to form the channel region of the third transistor T3. The fourth active portion 124 is used to form the channel region of the fourth transistor T4. The fifth active portion 125 is used to form the channel region of the fifth transistor T5.

Figure 13:
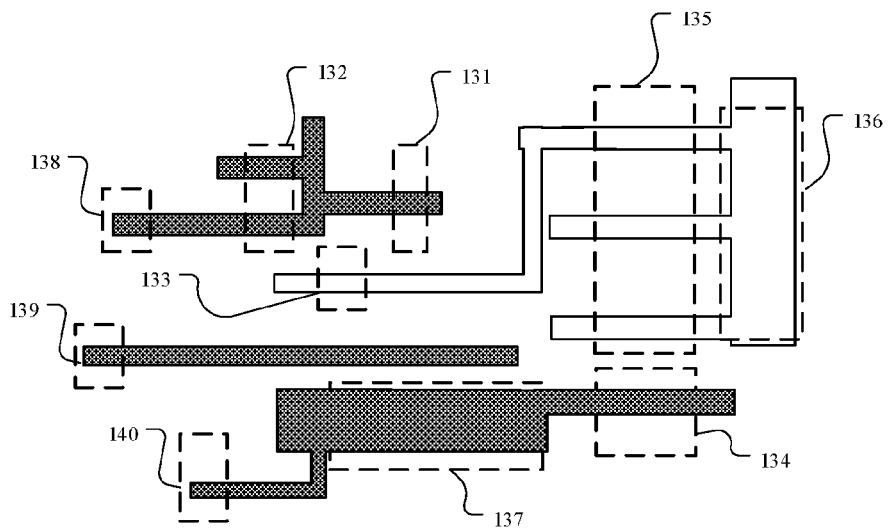
FIG. 13 is a schematic structural diagram of the first conductive layer in FIG. 11.

FIG. 13 is a schematic structural diagram of the first conductive layer in FIG. 11. The first conductive portion includes a conductive portion 131, a conductive portion 132, a conductive portion 133, a conductive portion 134, a conductive portion 135, a conductive portion 136, a conductive portion 137, a conductive portion 138, a conductive portion 139, and a conductive portion 140. The conductive portion 131 is used to form the gate of the first transistor T1. The conductive portion 132 is used to form the gate of the second transistor T2. The conductive portion 133 is used to form the gate of the third transistor T3. The conductive portion 134 is used to form the gate of the second transistor T4. The conductive portion 135 is used to form the gate of the fifth transistor T5. The conductive portion 136 is used to form the first electrode of the second capacitor. The conductive portion 137 is used to form the first electrode of the first capacitor. The conductive portion 138 and the conductive portion 132 are connected to form a first clock signal terminal. In FIG. 4, the conductive portion 138 can be connected to the first clock signal line segment CK. The conductive portion 139 is used to form the second clock signal terminal. In FIG. 4, the conductive portion 139 may be connected to the second clock signal line segment CB. The conductive portion 140 is connected to the conductive portion 137 to form a second power supply terminal. In FIG. 4, the conductive portion 140 may be connected to the second power supply line segment VGH.

Figure 14:
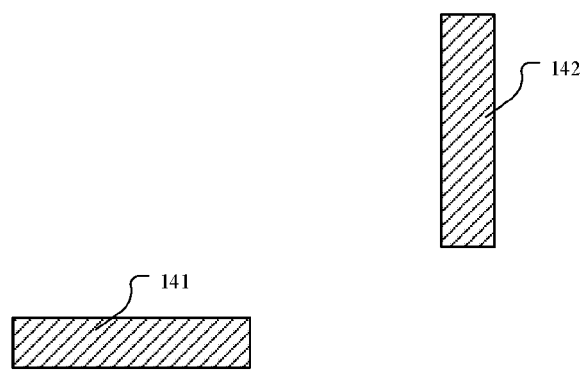
FIG. 14 is a schematic structural diagram of the second conductive layer in FIG. 11.

As shown in FIG. 14, it is a schematic structural diagram of the second conductive layer in FIG. 11. The second conductive layer includes a conductive portion 141 and a conductive portion 142. The conductive portion 141 is used to form the second electrode of the first capacitor. The conductive portion 142 is used to form the second electrode of the second capacitor.

Figure 15:
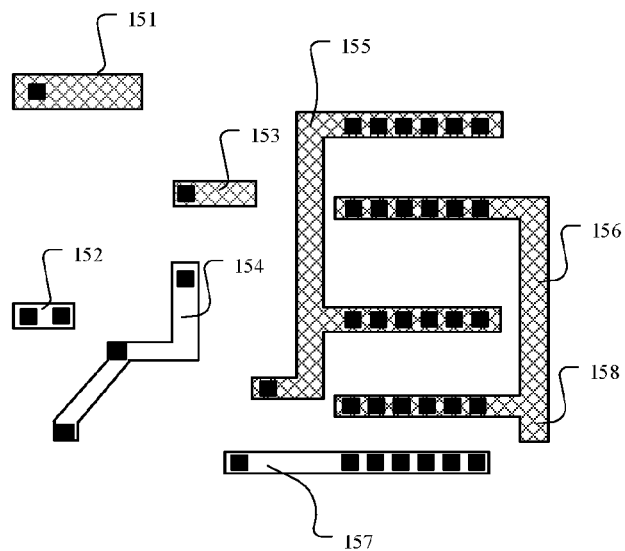
FIG. 15 is a schematic structural diagram of the third conductive layer in FIG. 11.

As shown in FIG. 15, it is a schematic structural diagram of the third conductive layer in FIG. 11. The third conductive layer may include a conductive portion 151, a conductive portion 152, a conductive portion 153, a conductive portion 154, a conductive portion 155, a conductive portion 156, a conductive portion 157, and a conductive portion 158. The conductive portion 151 is connected to one side of the second active portion 122 through a via hole, and is used to form a signal input terminal Input, such that the signal input terminal is connected to the first end of the second transistor. The conductive portion 152 is respectively connected to the other side of the second active portion 122 and the conductive portion 133 through via holes, such that the second end of the second transistor is connected to the gate of the third transistor. The conductive portion 153 may be connected to one side of the first active portion 121 through a via hole, so as to form a first power supply terminal, such that the first end of the first transistor is connected to the first power supply terminal. In FIG. 4, the conductive portion 153 may be connected to the first power line segment VGL. The conductive portion 154 is respectively connected to the other side of the first active portion 121, one side of the third active portion 123 and the conductive portion 137 through via holes, so that the second end of the first transistor, the first end of the third transistor, and an electrode of the first capacitor are connected to each other. The conductive portion 155 is respectively connected to the same side of the three fifth active portions 125 and the conductive portion 139 through via holes, such that the first end of the fifth transistor is connected to the second clock signal terminal CB. The conductive portion 158 is connected to the conductive portion 156, to form an output terminal. The conductive portion 156 is respectively connected to the other side of the three fifth active portions 125 through via holes, such that the second end of the fifth transistor is connected to the output terminal. The conductive portion 157 is respectively connected to one side of the fourth active portion 124 and the conductive portion 141 through via holes, such that the first end of the fourth transistor is connected to the second power supply terminal VGH.

In an exemplary embodiment, as shown in FIGS. 4 and 11, the display panel may include a pixel unit located between the first shift register unit and the first signal line segment group (for example, the pixel unit located in the middle in FIG. 4). The orthographic projection of the first clock connection line on the base substrate and the orthographic projection of the second clock connection line on the base substrate are respectively located at opposite sides of the pixel unit (for example, the pixel unit located in the middle in FIG. 4). According to FIGS. 10a and 10b, it can be seen that the polarities of the clock signals output by the first clock signal line segment and the second clock signal line segment are opposite, which can prevent the first clock connection line 92 and the second clock connection line 93 from being arranged adjacent to each other, and then prevent the signals on the first clock connection line 92 and the second clock connection line 93 from interfering with each other. As shown in FIG. 4, the first power supply connection line 91 may be located on the side of the first clock connection line 92 away from the pixel unit, and the second power supply connection line may be located on the side of the second clock connection line 93 away from the pixel unit. The arrangement can prevent the first clock connection line from being arranged adjacent to the second clock connection line of the previous pixel row, and at the same time, it can prevent the second clock connection line from being arranged adjacent to the first clock connection line of the next pixel row.

In an exemplary embodiment, as shown in FIGS. 4 and 11, the first transistor T1, the second transistor T2 and the third transistor T3 may be located at a side of the fourth transistor T4 and the fifth transistor T5 away from a pixel unit (for example, the rightmost pixel unit in FIG. 4). This setting can make the output ends of the fourth transistor T4 and the fifth transistor T5 adjacent to the pixel unit (the rightmost pixel unit in FIG. 4). That is, the output ends may be adjacent to the rightmost pixel unit in FIG. 4. The output end can be connected to the adjacent pixel drive circuit in the pixel unit through a short gate line.

In an exemplary embodiment, the second capacitor C2 may be located on a side of the fourth transistor and the fifth transistor away from the first transistor, the second transistor and the third transistor. That is, the second capacitor C2 may be located between the fourth transistor, the fifth transistor and the rightmost pixel unit in FIG. 4. This setting can isolate a part of the transistors in the first shift register unit from the transistors in the rightmost pixel unit in FIG. 4 through the second capacitor C2, thereby avoiding patterning of each functional structure layer of the transistors in the display panel being too dense, and then reducing the process difficulty in the patterning process of the display panel.

Figure 16:
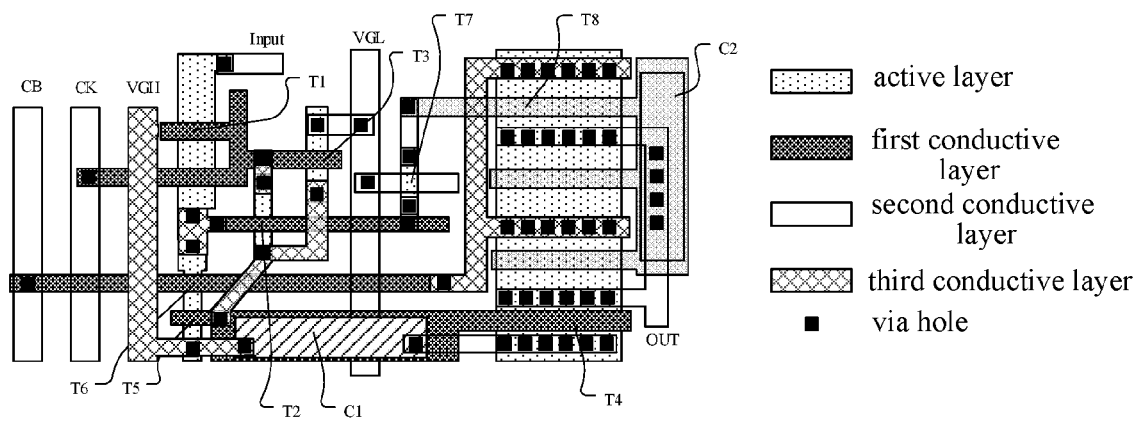
FIG. 16 is a design layout of a second gate drive circuit in the display panel of the present disclosure.

In an exemplary embodiment, FIG. 16 is a design layout of the second gate drive circuit in the display panel of the present disclosure. As shown in FIG. 16, the second signal line group may include a first clock signal line CK, a second clock signal line CB, a first power supply line VGL, and a second power supply line VGH. The second shift register unit includes first to eighth transistors T1-T8 and a first capacitor C1 and a second capacitor C2. The connection structure of the transistor and the capacitor in the second shift register unit may be the same as the circuit structure in FIG. 9. The second gate drive circuit can also be formed by the above-mentioned active layer, the first conductive layer, the second conductive layer, and the third conductive layer which are sequentially stacked on the base substrate.

Figure 17:
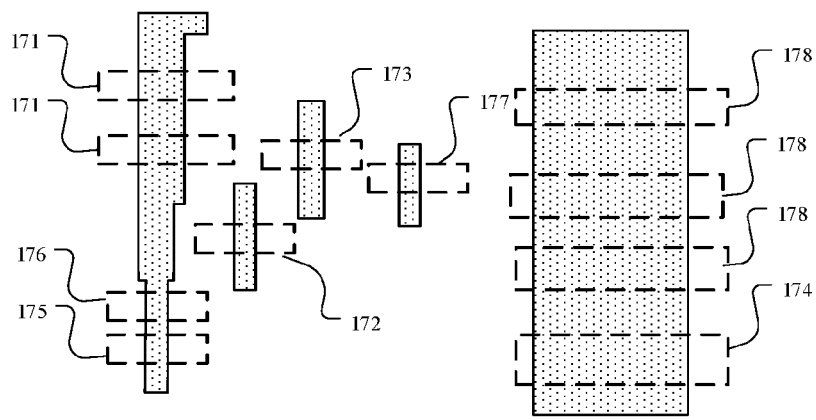
FIG. 17 is a schematic structural diagram of the active layer in FIG. 16.

FIG. 17 is a schematic structural diagram of the active layer in FIG. 16. The active layer may include a first active portion 171, a second active portion 172, a third active portion 173, a fourth active portion 174, a fifth active portion 175, a sixth active portion 176, a seventh active portion 177 and an eighth active portion 178. The first active portion 171 is used to form the channel region of the first transistor. The second active portion 172 is used to form the channel region of the second transistor. The third active portion 173 is used to form the channel region of the third transistor. The fourth active portion 174 is used to form the channel region of the fourth transistor. The fifth active portion 175 is used to form the channel region of the fifth transistor. The sixth active portion 176 is used to form the channel of the sixth transistor. The seventh active portion 177 is used to form the channel region of the seventh transistor. The eighth active portion 178 is used to form the channel region of the eighth transistor.

Figure 18:
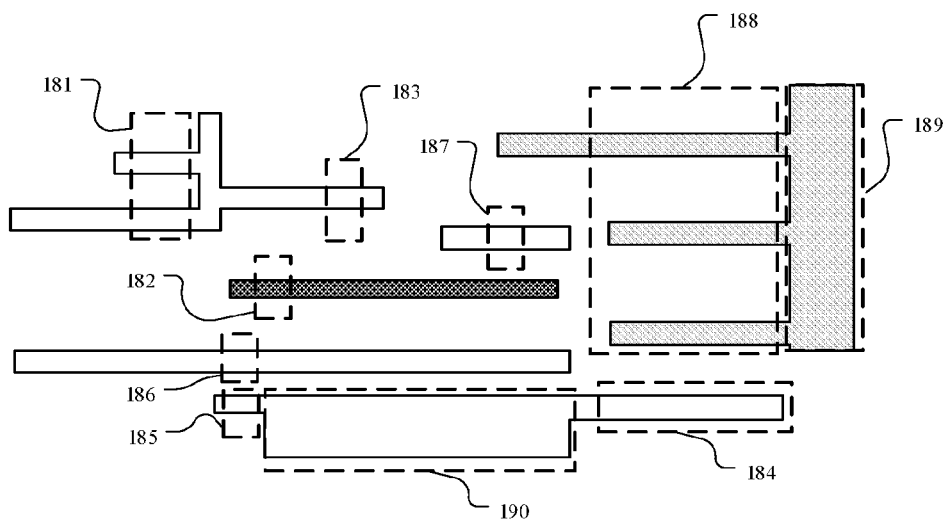
FIG. 18 is a schematic structural diagram of the first conductive layer in FIG. 16.

FIG. 18 is a schematic structural diagram of the first conductive layer in FIG. 16. The first conductive layer includes a conductive portion 181, a conductive portion 182, a conductive portion 183, a conductive portion 184, a conductive portion 185, a conductive portion 186, a conductive portion 187, a conductive portion 188, a conductive portion 189 and a conductive portion 190. The conductive portion 181 is used to form the gate of the first transistor. The conductive portion 182 is used to form the gate of the second transistor. The conductive portion 183 is used to form the gate of the third transistor. The conductive portion 184 is used to form the gate of the fourth transistor. The conductive portion 185 is used to form the gate of the fifth transistor. The conductive portion 186 is used to form the gate of the sixth transistor. The conductive portion 187 is used to form the gate of the seventh transistor. The conductive portion 188 is used to form the gate of the eighth transistor. The conductive portion 189 is used to form an electrode of the second capacitor. The conductive portion 190 is used to form an electrode of the first capacitor.

Figure 19:
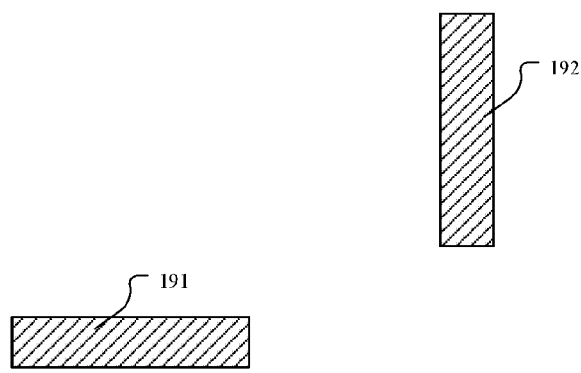
FIG. 19 is a schematic structural diagram of the second conductive layer in FIG. 16.

FIG. 19 is a schematic structural diagram of the second conductive layer in FIG. 16. The second conductive layer includes a conductive portion 191 and a conductive portion 192. The conductive portion 192 is used to form the other electrode of the second capacitor, and the conductive portion 191 is used to form the other electrode of the first capacitor.

Figure 20:
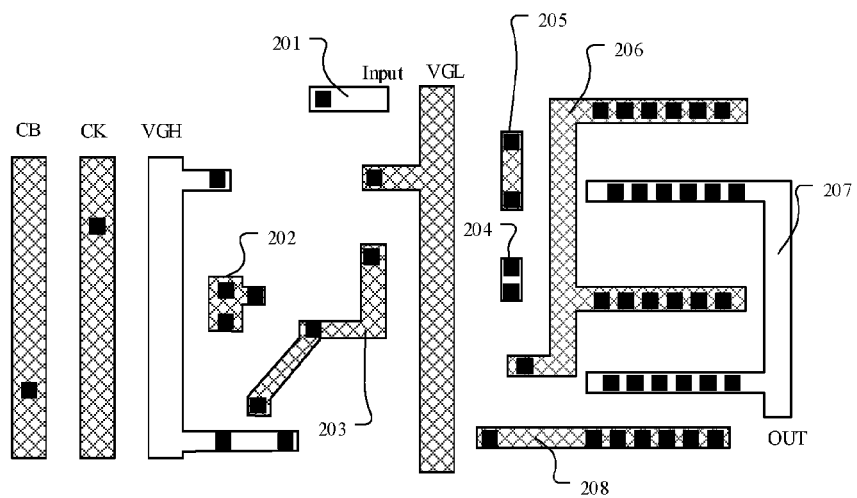
FIG. 20 is a schematic structural diagram of the third conductive layer in FIG. 16.

FIG. 20 is a schematic structural diagram of the third conductive layer in FIG. 16. The third conductive layer includes a first clock signal line CK, a second clock signal line CB, a first power supply line VGL, a second power supply line VGH, conductive portions 201 to 208. The first clock signal line CK is electrically connected to the conductive portion 181 through a via hole, so that the first clock signal line is connected to the gate of the first transistor. The second power supply line VGH is connected to the conductive portion 191 through a via hole, so that the second power supply line is connected to an electrode of the first capacitor. The second power line VGH is electrically connected to one side of the fifth active portion 175 through a via hole, so that the second power supply line VGH is connected to the first end of the fifth transistor. The second clock signal line CB is electrically connected to the conductive portion 186 through a via hole, so that the second clock signal line is connected to the gate of the sixth transistor. The first power supply line VGL is connected to the third active portion 173 through a via hole, so that the first power supply line is connected to the first end of the third transistor. The conductive portion 201 is connected to one side of the first active portion 171 through a via hole, to form a signal input terminal. The conductive portion 202 is respectively connected to the other side of the first active portion 171 and the conductive portion 182 through via holes, such that the second end of the first transistor, the second end of the sixth transistor, and the gate of the second transistor are connected to each other. The conductive portion 203 is respectively connected to one side of the third active portion 173, one side of the second active portion 172, and the conductive portion 190 through via holes, so that the second end of the second transistor, the first end of the third transistor, and an electrode of the first capacitor are connected to each other. The conductive portion 204 is respectively connected to one side of the seventh active portion 177 and the conductive portion 182 through via holes, so that the gate of the second transistor is connected to the first end of the seventh transistor. The conductive portion 205 is respectively connected to the other side of the seventh active portion 177 and the conductive portion 188 through via holes, so that the second electrode of the seventh transistor is connected to the gate of the eighth transistor. The conductive portion 206 is respectively connected to the same side of the three eighth active portions 178 and the conductive portion 186 through via holes, so that the second clock signal line CB is connected to the first stage of the eighth transistor. The conductive portion 207 is connected to the other side of the three eighth active portions 178 through via holes, to form the output terminal OUT. The conductive portion 208 is respectively connected to one side of the fourth active portion 174 and the conductive portion 191 through via holes, so that the first end of the fourth transistor is connected to the second power supply line.

As shown in FIG. 4, the first signal line segment group 62 may be connected to the first shift register unit 61 through a first connection line group extending in the row direction.

The first signal line segment group may include: the first clock signal line segment CK, the second clock signal line segment CB, the first power supply line segment VGL, and the second power supply line segment VGH. As shown in FIG. 4, the first power supply signal line segment VGL may be located on one side of the first shift register unit. The first clock signal line segment CK, the second clock signal line segment CB, and the second power supply line segment VGH may be located on a side of the first power supply signal line segment VGL away from the first shift register unit 61. The first clock signal line segment CK, the second clock signal line segment CB, the first power supply line segment VGL and the second power supply line segment VGH may be formed by a part of the third conductive layer. The first connection line group may include: a first clock connection line 92, a second clock connection line 93, a first power supply connection line 91, and a second power supply connection line (including a first connection portion 941 and a second connection portion 942). The first clock signal line segment CK can be connected to the gates of the first transistor and the second transistor through the first clock connection line 92. Specifically, the first clock connection line 92 may be formed by a part of the first conductive layer. The first end of the first clock connection line 92 can be connected to the first clock signal line segment CK in FIG. 4 through a via hole, and the second end of the first clock connection line 92 can be connected to the conductive portion 138 in FIG. 13. The second clock signal line segment CB may be connected to a source/drain of the fifth transistor through the second clock connection line 93. Specifically, the second clock connection line 93 may be formed by a part of the first conductive layer. The first end of the second clock connection line 93 may be connected to the second clock signal line segment CB in FIG. 4 through a via hole, and the second end of the second clock connection line 93 may be connected to the conductive portion 139 in FIG. 13. The first power supply line segment VGL may be connected to a source/drain of the third transistor through the first power supply connection line 91. Specifically, the first power supply connection line 91 may be formed by a part of the third conductive layer. The first end of the first power supply connection line 91 may be connected to the first power supply line segment VGL, and the second end of the first power supply connection line 91 may be connected to the conductive portion 153 in FIG. 15. The second power supply line segment VGH may be connected to the second electrode of the first capacitor through the second power supply connection line. The second power supply connection line may include a first connection portion 941 and a second connection portion 942. The first connection portion 941 may be connected to the second power supply line segment VGH through a via hole, and the second connection portion 942 may be connected to the second electrode of the first capacitor through a via hole. The first connection portion 941 and the second connection portion 942 can be connected through a via hole located between the second power supply line segment VGH and the first capacitor.

In an exemplary embodiment, the pixel unit in the display panel includes a plurality of sub-pixel units, each sub-pixel unit includes a pixel drive circuit, the pixel drive circuit includes a switching transistor, and the gate of the switching transistor is used to receive the gate drive signal or enable signal provided by a gate drive circuit. In an exemplary embodiment, the gates of the switching transistors located in the same pixel row are connected to each other. Therefore, in an exemplary embodiment, when the drive signal is provided to the pixel units of the same row through the first shift register unit, it is only necessary to provide the drive signal to one adjacent pixel drive circuit, so that the entire row of pixel drive circuits can be provided with the drive signal. As shown in FIGS. 4 and 11, the second end of the fifth transistor is connected to the output terminal OUT, and the output terminal OUT can be connected to the pixel unit on the right side thereof through a gate line.

According to an aspect of the present disclosure, there is provided a display device including the above-mentioned display panel. The display device may be a mobile phone, a TV, a tablet computer, or the like.

Other embodiments of the present disclosure will readily occur to those skilled in the art upon consideration of the specification and practice of the disclosure disclosed herein. This disclosure is intended to cover any variations, uses, or adaptations of this disclosure that follow the general principles of this disclosure and include common general knowledge or conventional technical means in the technical field not disclosed by this disclosure. The specification and embodiments are to be regarded as exemplary only, with the true scope and spirit of the disclosure being indicated by the appended claims.

It is to be understood that the present disclosure is not limited to the precise structures described above and illustrated in the accompanying drawings, and that various modifications and changes may be made without departing from the scope thereof. The scope of the present disclosure is limited only by the appended claims.

What is claimed is:

1. A display panel, comprising a display region, a border region located around the display region, a stretching region located at a corner of the display panel, a normal display region located in the display region, and a transition region located between the stretching region and the normal display region, wherein the display panel further comprises:
    a base substrate;
    a plurality of pixel units, located on a side of the base substrate and integrated in the transition region, wherein the plurality of pixel units are distributed in the transition region in rows and columns;
    a first gate drive circuit, located on a side of the base substrate facing the pixel unit and integrated in the transition region, wherein the first gate drive circuit comprises a first shift register unit and a first signal line group, the first signal line group comprises a first signal line segment group configured to provide a drive signal to the first shift register unit;
    wherein, the base substrate comprises a plurality of integration portions, the integration portions are located between orthographic projections of two adjacent pixel units in an identical row on the base substrate, and an orthographic projection of the first shift register unit on the base substrate and an orthographic projection of the first signal line segment group on the base substrate are respectively located in different integration portions in an identical row;
    a second gate drive circuit, located on a side of the base substrate facing the pixel unit, and integrated in the border region, wherein the second gate drive circuit comprises a plurality of cascaded second shift register units;
    an amount of transistors in the first shift register unit is less than that of transistors in one of the plurality of cascaded second shift register units.

2. The display panel according to claim 1, wherein the orthographic projection of the first shift register unit on the base substrate and the orthographic projection of the first signal line segment group on the base substrate are respectively located in two adjacent integration portions in an identical row.

3. The display panel according to claim 1, wherein the plurality of pixel units form a plurality of pixel islands distributed in rows and columns, and an orthographic projection of the first gate drive circuit on the base substrate is located between orthographic projections of adjacent pixel islands on a plane where the base substrate is located.

4. The display panel according to claim 3, wherein each of the pixel islands comprises two pixel units distributed along a column direction, and each of the pixel islands comprises: a B pixel opening and a R pixel opening located in a first pixel opening row and adjacently arranged, two G pixel openings located in a second pixel opening row and distributed along the column direction, and a B pixel opening and a R pixel opening located in a third pixel opening row and arranged adjacently;
wherein the second pixel opening row is located between the first pixel opening row and the third pixel opening row, pixel openings of an identical color are located in an identical pixel opening column, and pixel openings of different colors are located in different pixel opening columns.

5. The display panel according to claim 3, wherein the first gate drive circuit comprises a plurality of cascaded first shift register units, and the first signal line group comprises a plurality of first signal line segment groups arranged in one-to-one correspondence with the first gate drive circuit, and the first signal line segment groups are respectively configured to provide the drive signal to corresponding first shift register units.

6. The display panel according to claim 5, wherein the transition region comprises a bending edge region extending along a curve, and orthographic projections of at least a part of the first shift register units located in the bending edge region on the base substrate are located in different columns, and correspondingly, orthographic projections of at least a part of the first signal line segment groups located in the bending edge region on the base substrate are located in different columns.

7. The display panel according to claim 6, wherein the first signal line segment groups located in different columns are connected through a connection line segment group extending in a row direction, an orthographic projection of the connection line segment group on the base substrate is located between the orthographic projections of the adjacent pixel islands on the plane where the base substrate is located.

8. The display panel according to claim 5, further comprising:
a second signal line group configured to provide a drive signal to the plurality of cascaded second shift register units;
wherein the plurality of cascaded second shift register units and the plurality of cascaded first shift register units are cascaded, and signal lines of an identical type in the first signal line group and in the second signal line group are connected.

9. The display panel according to claim 1, wherein the first signal line group comprises one or more of a clock signal line and a power supply signal line.

10. The display panel according to claim 1, wherein the first shift register unit comprises:
a first input circuit, connected to a first clock signal terminal, a first power supply terminal and a first node, configured to transmit a signal of the first power supply terminal to the first node in response to a signal of the first clock signal terminal;
a second input circuit, connected to the first clock signal terminal, a signal input terminal and a second node, and configured to transmit a signal of the signal input terminal to the second node in response to the signal of the first clock signal terminal;
a control circuit, connected to the first node, the second node and the first clock signal terminal, configured to transmit the signal of the first clock signal terminal to the first node in response to a signal of the second node;
a first output circuit, connected to the first node, a second power supply terminal and an output terminal, and configured to transmit a signal of the second power supply terminal to the output terminal in response to a signal of the first node;
a second output circuit, connected to the second node, a second clock signal terminal and the output terminal, and configured to transmit a signal of the second clock signal terminal to the output terminal in response to the signal of the second node.

11. The display panel according to claim 10, wherein, the first input circuit comprises:
a first transistor, having a first end connected to the first power supply terminal, a second end connected to the first node, and a control end connected to the first clock signal terminal;
the second input circuit comprises:
a second transistor, having a first end connected to the signal input terminal, a second end connected to the second node, and a control end connected to the first clock signal terminal;
the control circuit comprises:
a third transistor, having a first end connected to the first node, a second end connected to the first clock signal terminal, and a control end connected to the second node;
the first output circuit comprises:
a fourth transistor, having a first end connected to the second power supply terminal, a second end connected to the output terminal, and a control end connected to the first node;
a first capacitor, connected between the second power supply terminal and the first node;
the second output circuit comprises:
a fifth transistor, having a first end connected to the second clock signal terminal, a second end connected to the output terminal, and a control end connected to the second node;
a second capacitor, connected between the second node and the output terminal.

12. The display panel according to claim 11, wherein the first signal line segment group is connected to the first shift register unit through a first connection line group extending along a row direction;
the first signal line segment group comprises: a first clock signal line segment, a second clock signal line segment, a first power supply line segment, and a second power supply line segment;
the first connection line group comprises: a first clock connection line, a second clock connection line, a first power supply connection line, and a second power supply connection line;
wherein the first clock signal line is connected to gates of the first transistor and the second transistor through the first clock connection line, the second clock signal line segment is connected to a source/drain of the fifth transistor through the second clock connection line, the first power supply line segment is connected to a source/drain of the third transistor through the first power supply connection line, and the second power supply line segment is connected to an electrode of the first capacitor through the second power supply connection line.

13. The display panel according to claim 12, wherein the display panel comprises an active layer, a first conductive layer, a second conductive layer, and a third conductive layer that are sequentially stacked on a side of the base substrate;
　a part of the active layer is configured to form a channel region of each transistor in the first shift register unit, and a part of the first conductive layer is configured to form a gate of each transistor in the first shift register unit and a first electrode of the first capacitor and the second capacitor, a part of the second conductive layer is configured to form a second electrode of the first capacitor and the second capacitor, and a part of the third conductive layer is configured to form a source/drain of each transistor in the first shift register unit;
　the first power supply line segment is located on a side of the first shift register unit, the first clock signal line segment, the second clock signal line segment and the second power supply line segment are located on a side of the first power supply line segment away from the first shift register unit;
　the first power supply connection line is formed by a part of the third conductive layer, and the first clock connection line and the second clock connection line are formed by a part of the first conductive layer;
　the second power supply connection line comprises a first connection portion and a second connection portion, the first connection portion is connected to the second power supply line segment through a via hole, the second connection portion is connected to the second electrode of the first capacitor through a via hole, and the first connection portion and the second connection portion are connected through a via hole located between the second power supply line segment and the first capacitor, wherein the first connection portion is formed by a part of the first conductive layer, and a second conductive portion is formed of a part of the third conductive layer.

14. The display panel according to claim 12, wherein the display panel comprises a pixel unit located between the first shift register unit and the first signal line segment group;
　an orthographic projection of the first clock connection line on the base substrate and an orthographic projection of the second clock connection line on the base substrate are respectively located on opposite two sides of the pixel unit.

15. The display panel according to claim 11, wherein the first transistor, the second transistor and the third transistor are located on a side of the fourth transistor and the fifth transistor away from a pixel unit, and the output terminal is connected to an adjacent pixel drive circuit in the pixel unit through a gate line,
　wherein the second capacitor is located on a side of the fourth transistor and the fifth transistor away from the first transistor, the second transistor and the third transistor.

16. The display panel according to claim 1, wherein the second shift register unit comprises:
　a first transistor, having a first end connected to a signal input terminal, a second end connected to a first node, and a control end connected to a first clock signal terminal;
　a second transistor, having a first end connected to the first clock signal terminal, a second end connected to a second node, and a control end connected to the first node;
　a third transistor, having a first end connected to a first power supply terminal, a second end connected to the second node, and a control end connected to the first clock signal terminal;
　a fourth transistor, having a first end connected to a second power supply terminal, a second end connected to an output terminal, and a control end connected to the second node;
　a first capacitor, connected between the second node and the second power supply terminal;
　a fifth transistor, having a first end connected to the second power supply terminal, a second end connected to a third node, and a control end connected to the second node;
　a sixth transistor, having a first end connected to the third node, a second end connected to the first node, and a control end connected to a second clock signal terminal;
　a seventh transistor, having a first end connected to the first node, a second end connected to a fourth node, and a control end connected to the first power supply terminal;
　an eighth transistor, having a first end connected to the output terminal, a second end connected to the second clock signal terminal, and a control end connected to the fourth node;
　a second capacitor, connected between the fourth node and the output terminal.

17. The display panel according to claim 1, wherein a pixel density in the transition region is smaller than that in the normal display region.

18. The display panel according to claim 1, wherein the stretching region comprises a first stretching region located in the display region, and a pixel density in the first stretching region is smaller than that in the normal display region.

19. The display panel according to claim 1, comprising an array substrate and an encapsulation layer encapsulated on a side of the array substrate, wherein the stretching region is provided with a hollow opening penetrating the array substrate and the encapsulation layer.

20. A display device, comprising a display panel, wherein the display panel comprises a display region, a border region located around the display region, a stretching region located at a corner of the display panel, a normal display region located in the display region, and a transition region located between the stretching region and the normal display region, wherein the display panel further comprises:
　a base substrate;
　a plurality of pixel units, located on a side of the base substrate and integrated in the transition region, wherein the plurality of pixel units are distributed in the transition region in rows and columns;
　a first gate drive circuit, located on a side of the base substrate facing the pixel unit and integrated in the transition region, wherein the first gate drive circuit comprises a first shift register unit and a first signal line group, the first signal line group comprises a first signal line segment group configured to provide a drive signal to the first shift register unit;

wherein, the base substrate comprises a plurality of integration portions, the integration portions are located between orthographic projections of two adjacent pixel units in an identical row on the base substrate, and an orthographic projection of the first shift register unit on the base substrate and an orthographic projection of the first signal line segment group on the base substrate are respectively located in different integration portions in an identical row;

a second gate drive circuit, located on a side of the base substrate facing the pixel unit, and integrated in the border region, wherein the second gate drive circuit comprises a plurality of cascaded second shift register units;

an amount of transistors in the first shift register unit is less than that of transistors in one of the plurality of cascaded second shift register units.

* * * * *